(12) United States Patent
Shealy et al.

(10) Patent No.: US 7,557,421 B1
(45) Date of Patent: Jul. 7, 2009

(54) HYBRID RADIO FREQUENCY INTEGRATED CIRCUIT USING GALLIUM NITRIDE EPITAXY LAYERS GROWN ON A DONOR SUBSTRATE

(75) Inventors: Jeffrey B. Shealy, Huntersville, NC (US); Matthew Poulton, Concord, NC (US); Ramakrishna Vetury, Charlotte, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 131 days.

(21) Appl. No.: 11/458,833

(22) Filed: Jul. 20, 2006

(51) Int. Cl.
*H01L 29/20* (2006.01)

(52) U.S. Cl. .................. 257/499; 257/226; 257/615; 257/E31.096; 257/E25.029

(58) Field of Classification Search .............. 257/499, 257/723, 226, 615, E31.096, E25.029; 438/341, 438/481
See application file for complete search history.

(56) References Cited

U.S. PATENT DOCUMENTS

2003/0003630 A1* 1/2003 Iimura et al. ............... 438/127
2003/0160317 A1* 8/2003 Sakamoto et al. .......... 257/690

* cited by examiner

*Primary Examiner*—Sue Purvis
*Assistant Examiner*—Tan N Tran
(74) *Attorney, Agent, or Firm*—Withrow & Terranova, P.L.L.C.

(57) ABSTRACT

The present invention is a hybrid integrated circuit comprising at least two semiconductor dies. A high performance semiconductor die includes high performance epitaxy layers grown on a donor substrate, which may form active devices such as transistors. A supporting semiconductor die includes epitaxy layers of a commercially available technology and grown on a native substrate to form passive devices such as resistors, capacitors, inductors, backside via holes, or active devices such as transistors The semiconductor dies are attached to a metallic mounting structure and may be electrically interconnected using traditional IC interconnect methods, such as wire bonding. The metallic mounting structure may function as a grounding base, which may be formed of electrically conductive metal such as copper. The high performance epitaxy layers may include GaN epitaxy layers, AlGaN epitaxy layers, SiC epitaxy layers, or a combination of the three.

19 Claims, 3 Drawing Sheets

HYBRID RADIO FREQUENCY INTEGRATED CIRCUIT USING GALLIUM NITRIDE EPITAXY LAYERS GROWN ON A DONOR SUBSTRATE

FIELD OF THE INVENTION

The present invention relates to hybrid radio frequency (RF) integrated circuits (ICs) used in RF communications circuitry.

BACKGROUND OF THE INVENTION

As wireless technologies evolve, devices using these technologies become smaller and less expensive while wireless features grow in their requirements for increased performance and functionality. As a result, there are needs for increased power densities in the RF components used to make wireless devices, particularly those used in high power applications such as RF power amplifiers; therefore, new semiconductor technologies are being developed to address these needs.

Gallium nitride (GaN) is a semiconductor technology that offers significantly higher power density over other technologies such as silicon lateral diffused metal oxide semiconductor (LDMOS) transistors, gallium arsenide hetero junction bipolar transistors (HBT) and pseudo-morphic high electron mobility transistors (pHEMT). GaN devices using native GaN substrates are expensive and not readily available; however, GaN devices can be fabricated by growing GaN epitaxy layers, aluminum gallium nitride (AlGaN) epitaxy layers, or silicon carbide (SiC) epitaxy layers on a donor substrate, such as aluminum nitride (AlN), silicon carbide (SiC), sapphire, or silicon (Si). Even by using donor substrates, GaN devices are more expensive than other semiconductor technologies, such as gallium arsenide (GaAs).

RF ICs are commonly produced as complete functional devices, which contain most of the components necessary to implement their desired functions including both active and passive components; however, newer technologies, such as GaN, may not have the mature suite of passive components with which to fabricate a complete functional RF IC. Accordingly, there is a need for an efficient and cost effective way to build RF ICs using GaN technology.

SUMMARY OF THE INVENTION

The present invention is a hybrid integrated circuit comprising at least two semiconductor dies. A high performance semiconductor die includes high performance epitaxy layers grown on a donor substrate, which may form active devices such as transistors. A supporting semiconductor die includes epitaxy layers of a commercially available technology and grown on a native substrate to form passive devices such as resistors, capacitors, inductors, backside via holes, or active devices such as transistors. The semiconductor dies are attached to a metallic mounting structure and may be electrically interconnected using traditional IC interconnect methods, such as wire bonding. The metallic mounting structure may function as a grounding base, which may be formed of an electrically conductive metal such as copper. The high performance epitaxy layers may include GaN epitaxy layers, AlGaN epitaxy layers, SiC epitaxy layers, or a combination of the three.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE INVENTION

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
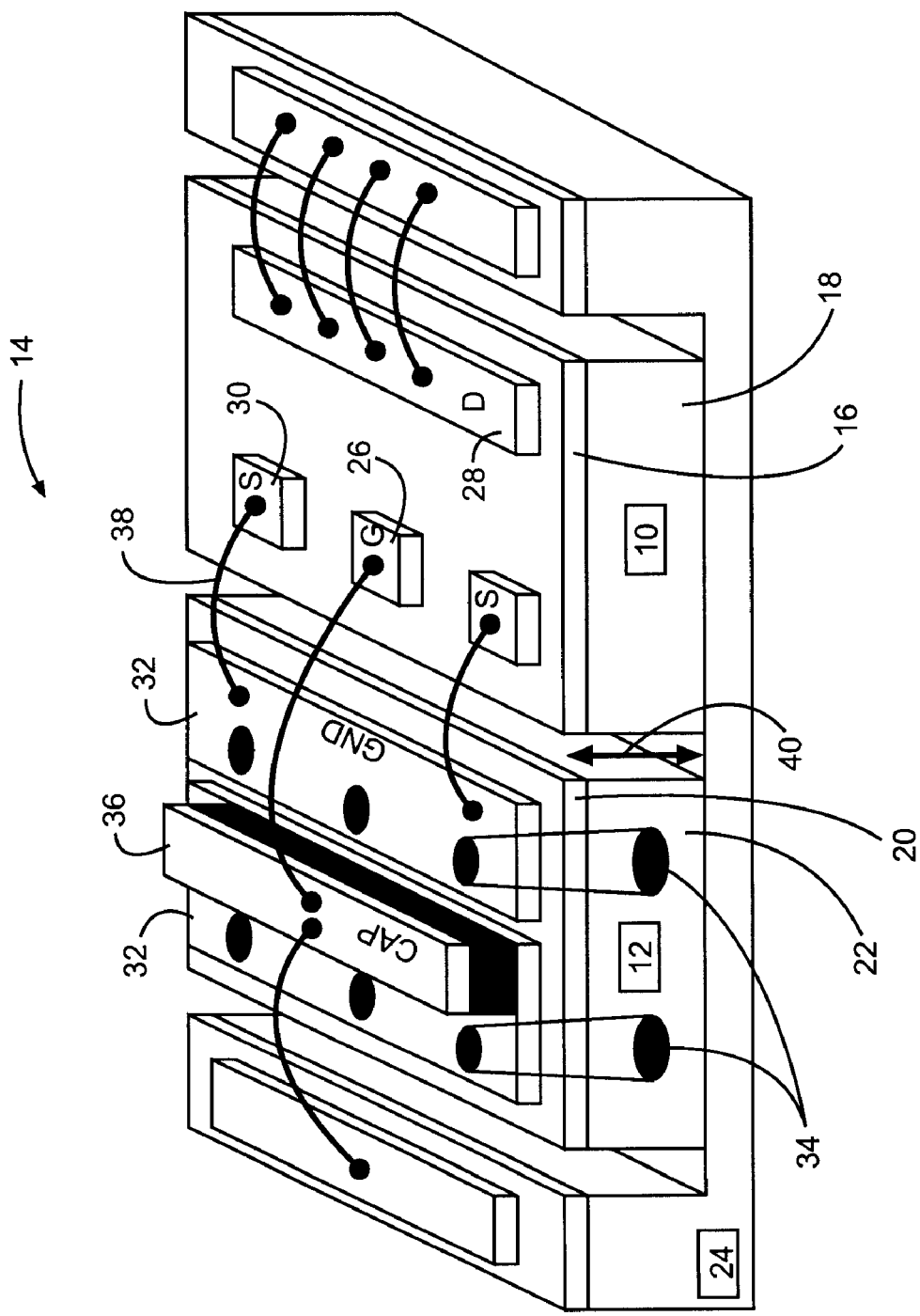
FIG. 1 shows how the present invention can be used to form a hybrid integrated circuit with a high performance semiconductor die and a supporting semiconductor die.

In one embodiment of the present invention, a high performance semiconductor die 10 and a supporting semiconductor die 12 are used in combination to form a transistor circuit in a hybrid integrated circuit (IC) 14, as shown in FIG. 1. The transistor circuit may require active and passive components. The high performance die 10 includes high performance epitaxy layers 16 grown on a donor substrate 18 to form high performance active components such as RF power transistors, wide bandgap active devices, or high electron mobility transistors. In other embodiments of the present invention, the high performance epitaxy layers 16 may include GaN, AlGaN, SiC, or a combination of the three, and the donor substrates 18 may include SiC, AlN, sapphire, or Si. The supporting die 12 functions as an integrated passive component (IPC) substrate, which includes epitaxy layers 20 grown on a native substrate 22 to form passive and active components. By offloading as many components as is optimal from the high performance semiconductor die 10 to the supporting semiconductor die 12, the size of the high performance semiconductor die 10 can be minimized, which helps minimize the cost of the hybrid IC 14. In other embodiments of the present invention, the supporting die 12 may include a more commercially available and cost effective technology, such as GaAs, Si, sapphire, AlN, indium phosphide (InP), or zinc oxide (ZnO).

Both dies 10, 12 are mounted to a metallic mounting structure 24, which may function as a grounding base and may include copper. The high performance epitaxy layers 16 form a high electron mobility transistor with attached metallic interconnect pads for making attachments to a gate 26, a drain 28, and a source 30. Frontside metallic grounding pads 32 used with backside via holes 34 provide ground connections to the metallic mounting structure 24. The frontside metallic grounding pads 32 provide ground attachment points for circuitry on both dies 10, 12. A capacitor 36 is formed by sandwiching a dielectric material between two metallic layers. Electrical interconnections between the two dies 10, 12 may be provided with wire bonds 38. To maximize heat transfer between the epitaxy layers 16, 20 and the metallic mounting structure 24, the die thickness 40 is less than 200 microns, preferably less than 100 microns. The thickness of the epitaxy layers 16, 20 is typically 1 to 2 microns when the overall die thickness is 100 microns.

Passive components such as inductors, capacitors, and resistors are used for impedance matching, filtering, decoupling, feedback, and other functions, and are necessary for complete circuit functionality; however, forming passive components on a semiconductor die may require large areas of the die; therefore, offloading these components to the supporting die 12 with a mature technology, such as GaAs, may provide a less expensive solution in many applications.

In another embodiment of the present invention, a power amplifier hybrid IC 14 is formed by using GaN high performance epitaxy layers 16 grown on a SiC donor substrate 18 to create power amplifier transistors on a high performance die 10. The high performance die 10 is attached to a copper metallic mounting structure 24, and GaAs epitaxy layers 20 grown on a native GaAs substrate 22 to create a supporting die 12, which contains the remaining power amplifier circuitry and is attached to the copper metallic mounting structure 24. Electrical interconnections between the two dies 10, 12 are provided with wire bonds 38.

SiC donor substrates 18 provide high thermal conductivity and are capable of high power densities; however, SiC is very hard; therefore, backside via holes may be difficult to form in SiC donor substrates 18. Offloading backside via holes 34 to the GaAs supporting die 12 provides a less expensive solution in many applications. GaAs is a mature technology that is less expensive to manufacture than GaN; therefore, by offloading as many of the passive and active components to the supporting die 12 as possible, an IC can be produced that is highly integrated and still affordable.

The high performance die 10 may contain active components and passive components such as resistors, capacitors, inductors, backside vias, or any combination thereof. Further, the supporting die 12 may contain active components and passive components such as resistors, capacitors, inductors, backside vias, or any combination thereof.

Figure 2:
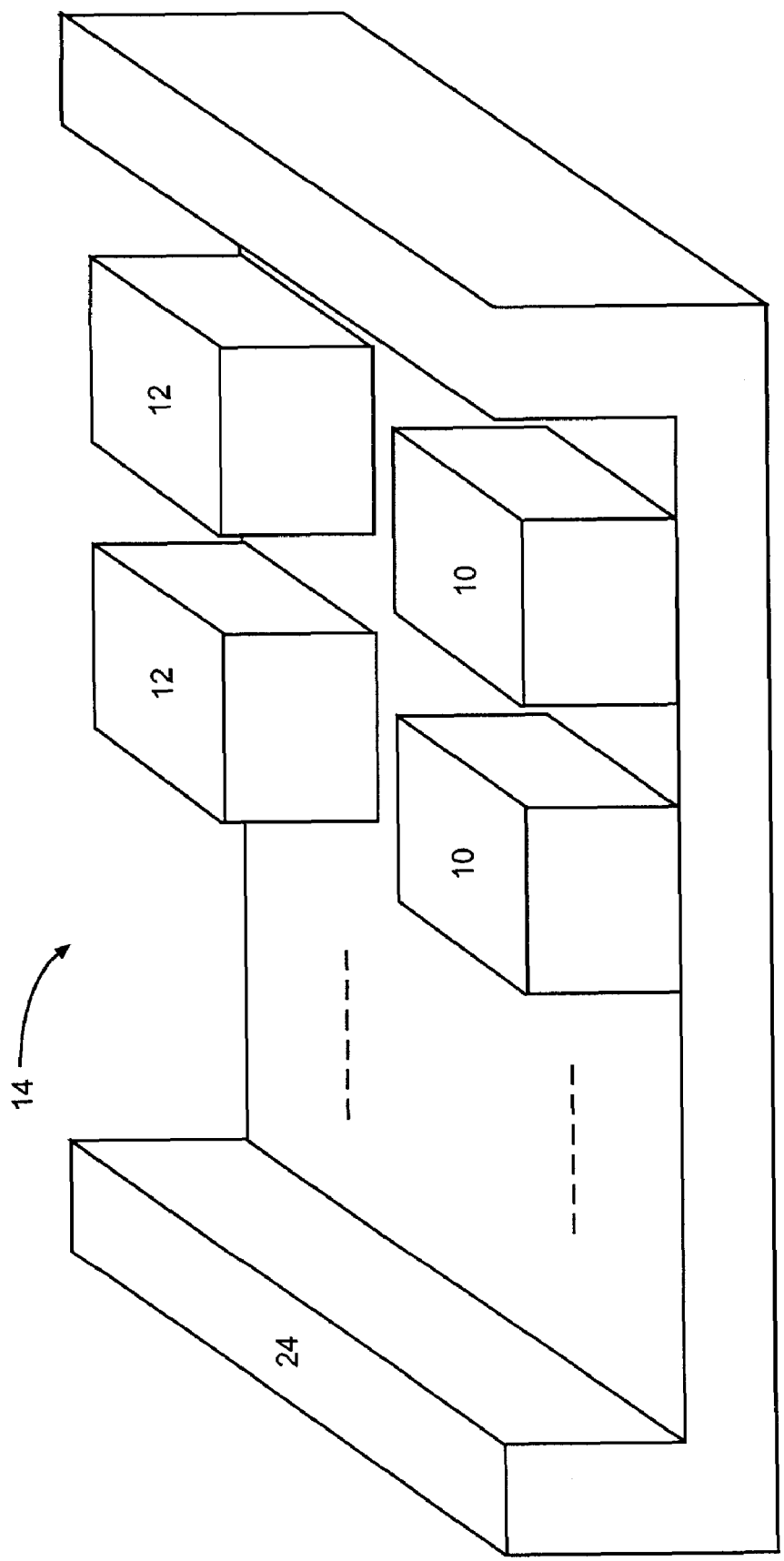
FIG. 2 shows how the present invention can be used to form a hybrid integrated circuit using multiple high performance semiconductor dies and multiple supporting semiconductor dies.

In another embodiment of the present invention, a hybrid IC 14 includes a combination of multiple high performance dies 10 and multiple supporting dies 12 attached to a metallic mounting structure 24 as shown in FIG. 2.

Figure 3:
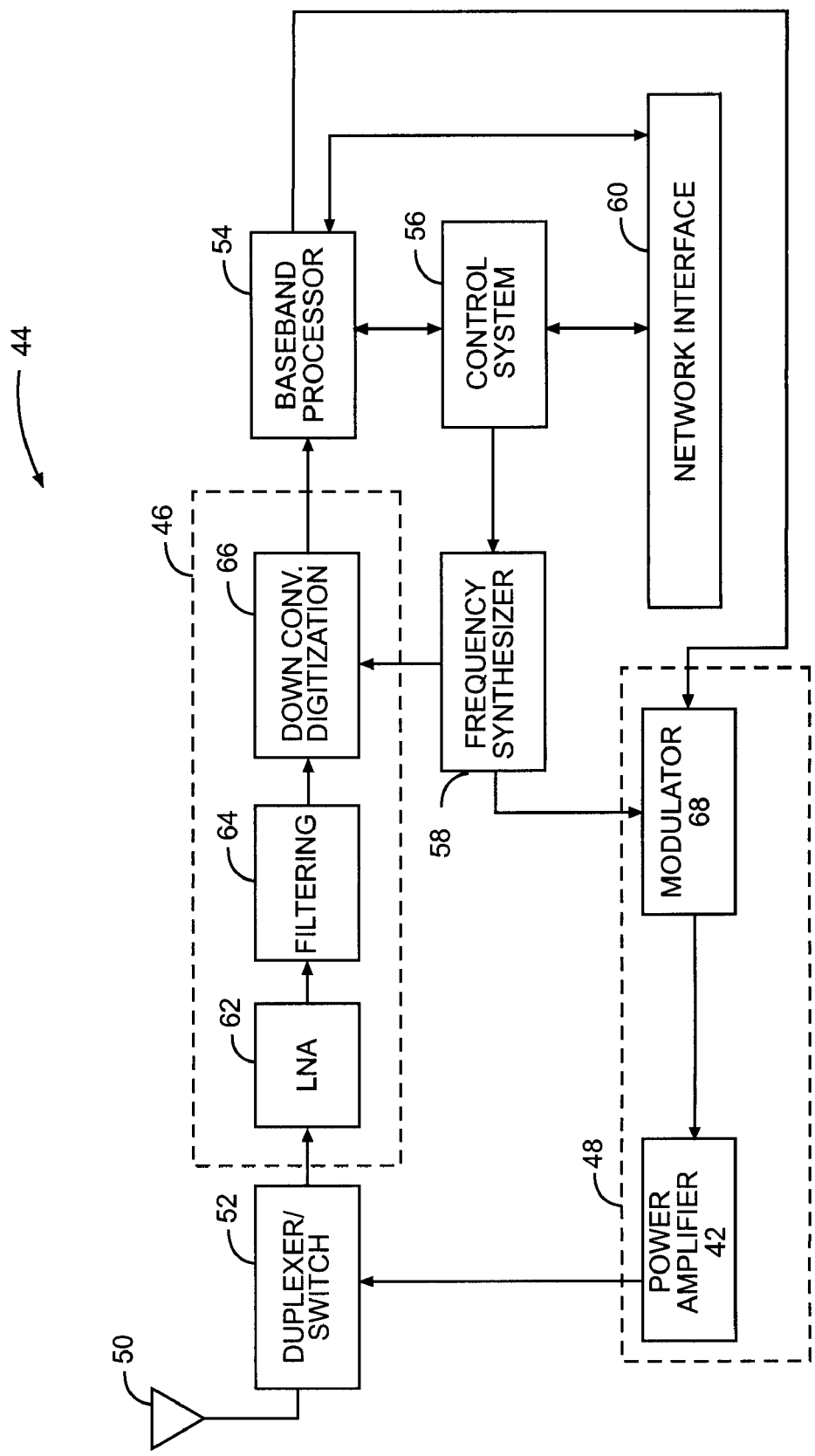
FIG. 3 shows an application example of the present invention used to create a power amplifier integrated circuit, which is used in an RF base station.

With reference to FIG. 3, an application example of a hybrid GaN IC is its use as a power amplifier 42 in an RF base station 44. The basic architecture of the RF base station 44 may include a receiver front end 46, a radio frequency transmitter section 48, an antenna 50, a duplexer or switch 52, a baseband processor 54, a control system 56, a frequency synthesizer 58, and a network interface 60. The receiver front end 46 receives information bearing radio frequency signals from one or more remote transmitters provided by other network elements. A low noise amplifier (LNA) 62 amplifies the signal. A filter circuit 64 minimizes broadband interference in the received signal, while downconversion and digitization circuitry 66 downconverts the filtered, received signal to an intermediate or baseband frequency signal, which is then digitized into one or more digital streams. The receiver front end 46 typically uses one or more mixing frequencies generated by the frequency synthesizer 58. The baseband processor 54 processes the digitized received signal to extract the information or data bits conveyed in the received signal. This processing typically comprises demodulation, decoding, and error correction operations. As such, the baseband processor 54 is generally implemented in one or more digital signal processors (DSPs).

On the transmit side, the baseband processor 54 receives digitized data, which may represent voice, data, or control information, from the control system 56, which it encodes for transmission. The encoded data is output to the transmitter 48, where it is used by a modulator 68 to modulate a carrier signal that is at a desired transmit frequency. The power amplifier 42 amplifies the modulated carrier signal to a level appropriate for transmission, and delivers the amplified and modulated carrier signal to the antenna 50 through the duplexer or switch 52.

Other systems may interact with the RF base station 44 via the network interface 60 and may exchange information with the baseband processor 54, or the control system 56, or both.

Those skilled in the art will recognize improvements and modifications to the embodiments of the present invention. All such improvements and modifications are considered within the scope of the concepts disclosed herein and the claims that follow.

What is claimed is:

1. A hybrid integrated circuit comprising:
a metallic mounting structure;
a high performance semiconductor die mounted on the metallic mounting structure and comprising:
  a donor substrate comprising at least one of a group consisting of silicon carbide, sapphire, aluminum nitride, and silicon; and
  epitaxy layers grown on the donor substrate and comprising gallium nitride;
a supporting semiconductor die mounted on the metallic mounting structure; and
a transistor circuit comprising:
  at least one transistor formed in the high performance semiconductor die; and
  at least one passive component formed in the supporting semiconductor die and electrically coupled to the at least one transistor.

2. The hybrid integrated circuit of claim 1 wherein size of the high performance semiconductor die is minimized by including as many active and passive components as are optimal in the supporting semiconductor die.

3. The hybrid integrated circuit of claim 1 wherein thickness of the high performance semiconductor die is less than 200 microns.

4. The hybrid integrated circuit of claim 1 wherein thickness of the high performance semiconductor die is less than 100 microns.

5. The hybrid integrated circuit of claim 1 wherein thickness of the supporting semiconductor die is less than 200 microns.

6. The hybrid integrated circuit of claim 1 wherein the supporting semiconductor die further comprises at least one via hole forming part of the transistor circuit and providing electrical connection from a front side of the supporting semiconductor die to a back side of the supporting semiconductor die.

7. The hybrid integrated circuit of claim 1 wherein the high performance semiconductor die does not contain a via hole from a front side of the high performance semiconductor die to a back side of the high performance semiconductor die.

8. The hybrid integrated circuit of claim 1 wherein the metallic mounting structure is an electrical grounding base.

9. The hybrid integrated circuit of claim 1 wherein the metallic mounting structure comprises copper.

10. The hybrid integrated circuit of claim 1 wherein the at least one transistor is a radio frequency power transistor and the transistor circuit forms a radio frequency power amplifier.

11. The hybrid integrated circuit of claim 1 further comprising wire bond electrical interconnections between the high performance semiconductor die and the supporting semiconductor die.

12. The hybrid integrated circuit of claim 1 wherein the supporting semiconductor die does not contain active components.

13. The hybrid integrated circuit of claim 1 wherein the high performance semiconductor die does not contain passive components.

14. The hybrid integrated circuit of claim 1 wherein:
the metallic mounting structure comprises copper and functions as an electrical grounding base;
the supporting semiconductor die comprises gallium arsenide epitaxy layers grown on a native gallium arsenide substrate forming the at least one passive component; and
the at least one transistor, is a power transistor, wherein the transistor circuit forms a radio frequency power amplifier.

15. The hybrid integrated circuit of claim 14 further comprising wire bond electrical interconnections between the high performance semiconductor die and the supporting semiconductor die.

16. A method of manufacturing a hybrid integrated circuit comprising:
providing a metallic mounting structure;
creating a high performance semiconductor die on the metallic mounting structure, such that the high performance semiconductor die comprises a donor substrate comprising at least one of a group consisting of silicon carbide, sapphire, aluminum nitride, and silicon;
growing epitaxy layers on the donor substrate, such that the epitaxy layers comprise gallium nitride;
creating a supporting semiconductor die on the metallic mounting structure;
forming a transistor on the high performance semiconductor die;
forming a passive component on the supporting semiconductor die; and
electrically connecting the transistor and the passive component to form a transistor circuit.

17. A hybrid integrated circuit comprising:
a metallic mounting structure;
a high performance semiconductor die mounted on the metallic mounting structure and comprising:
a donor substrate comprising at least one of a group consisting of silicon carbide, sapphire, aluminum nitride, and silicon; and
epitaxy layers grown on the donor substrate and comprising aluminum gallium nitride;
a supporting semiconductor die mounted on the metallic mounting structure; and
a transistor circuit comprising:
at least one transistor formed in the high performance semiconductor die; and
at least one passive component formed in the supporting semiconductor die and electrically coupled to the at least one transistor.

18. A hybrid integrated circuit comprising:
a metallic mounting structure;
a high performance semiconductor die mounted on the metallic mounting structure and comprising:
a donor substrate comprising at least one of a group consisting of silicon carbide, sapphire, aluminum nitride, and silicon; and
epitaxy layers grown on the donor substrate and comprising silicon carbide;
a supporting semiconductor die mounted on the metallic mounting structure; and
a transistor circuit comprising:
at least one transistor formed in the high performance semiconductor die; and
at least one passive component formed in the supporting semiconductor die and electrically coupled to the at least one transistor.

19. A hybrid integrated circuit comprising:
a metallic mounting structure;
a high performance semiconductor die mounted on the metallic mounting structure; a supporting semiconductor die mounted on the metallic mounting structure and comprising gallium arsenide epitaxy layers grown on a native gallium arsenide substrate; and
a transistor circuit comprising:
at least one transistor formed in the high performance semiconductor die; and
at least one passive component formed in the supporting semiconductor die and electrically coupled to the at least one transistor.

* * * * *